United States Patent
Mochizuki et al.

(10) Patent No.: US 7,152,667 B2
(45) Date of Patent: Dec. 26, 2006

(54) TOWER TYPE FINNED HEAT PIPE TYPE HEAT SINK

(75) Inventors: Masataka Mochizuki, Nagareyama (JP); Koichi Mashiko, Utsunomiya (JP)

(73) Assignee: Fujikura Ltd., Tokyo (JP)

( * ) Notice: Subject to any disclaimer, the term of this patent is extended or adjusted under 35 U.S.C. 154(b) by 465 days.

(21) Appl. No.: 10/230,982

(22) Filed: Aug. 30, 2002

(65) Prior Publication Data

US 2003/0066628 A1   Apr. 10, 2003

Related U.S. Application Data

(60) Provisional application No. 60/327,787, filed on Oct. 10, 2001.

(51) Int. Cl.
*F28D 15/00* (2006.01)
*H05K 7/20* (2006.01)

(52) U.S. Cl. .............. 165/104.34; 165/80.3; 165/104.21; 361/700

(58) Field of Classification Search ........... 165/104.21, 165/104.26, 104.33, 185, 181, 182; 29/890.046; 361/700; 174/15.2, 16.3; 257/714, 715
See application file for complete search history.

(56) References Cited

U.S. PATENT DOCUMENTS

| | | | |
|---|---|---|---|
| 3,852,806 A * | 12/1974 | Corman et al. | 165/104.33 |
| 4,885,129 A * | 12/1989 | Leonard et al. | 419/2 |
| 5,216,580 A * | 6/1993 | Davidson et al. | 361/700 |
| 5,396,947 A * | 3/1995 | Itoh | 165/104.14 |
| 5,412,535 A | 5/1995 | Chao et al. | |
| 5,582,242 A * | 12/1996 | Hamburgen et al. | 165/104.33 |
| 5,632,158 A | 5/1997 | Tajima | |
| 6,061,235 A | 5/2000 | Cromwell et al. | |
| 6,266,882 B1 * | 7/2001 | Ali et al. | 29/890.046 |
| 2001/0037875 A1 * | 11/2001 | Guerrero | 165/80.3 |
| 2002/0080582 A1 * | 6/2002 | Chang | 361/700 |

FOREIGN PATENT DOCUMENTS

JP          57-179589     * 11/1982     ............ 29/890.032

* cited by examiner

*Primary Examiner*—Tho Duong
(74) *Attorney, Agent, or Firm*—Oblon, Spivak, McClelland, Maier & Neustadt, P.C.

(57) ABSTRACT

A heat sink comprises: a base portion having one face to be contacted by an exothermic member; a heat pipe erected on the other face of the base portion; and a plurality of fins mounted on the outer face of the heat pipe. Further comprised are: an axially short cylindrical member erected on the other face of the base portion; and a heat pipe container having one end portion closed and the other end portion opened and fitted at its opened end closely in the cylindrical member. The heat pipe is constructed by evacuating the inside of the heat pipe container and then by encapsulating a working fluid in the heat pipe container, so that a heat may be transferred to the heat pipe through the base portion and the cylindrical member.

18 Claims, 2 Drawing Sheets

TOWER TYPE FINNED HEAT PIPE TYPE HEAT SINK

BACKGROUND OF THE INVENTION

1. Field of the Invention

The present invention relates to a heat sink for transferring a heat through a heat pipe and for dissipating the heat through fins mounted on the outer circumference of the heat pipe.

2. Related Art

In recent years, the electronic parts composing the major portion of an information processing device have been highly integrated to put the LSI or VLSI to practical use. This high integration of the electronic parts is realized by reducing the sizes of unit elements so that their calorific powers grow the higher proportionally as the degree of integration is improved the better. In order to avoid the malfunctions or breakages of the electronic parts due to the higher temperature, therefore, it has been desired to cool the electronic parts by radiating their heats effectively.

In the prior art, there have been used heat sinks of various structures according to the shapes of the electronic parts and the internal space of the case, in which the electronic parts are arranged. For example, there has been known the heat sink of the structure, in which plate- or rod-shaped fins made of a metal are erected on a metal base, or the heat sink in which folded fins folded zigzag from a thin metal sheet or tape are fixed on a metal plate or sheet type heat pipe. In the prior art, moreover, there has been known the heat sink in which the heat pipe is used as means for radiating the heat or means for transferring the heat to the radiation fins.

The heat sink using the heat pipe is exemplified by the tower type heat sink, as disclosed in U.S. Pat. No. 5,412,535 and will be shortly described in the following. An electronic part is jointed to the lower face of a base plate, on the upper face of which a tube having a closed upper end portion is mounted at its opened lower end portion in a sealed state. This tube is a container for the heat pipe, which is evacuated to encapsulate a working fluid, so that it acts as the heat pipe.

On the other hand, the opened portion on the lower end side of the tube is diverged to have a larger diameter, and the diverged end portion is fitted by a faucet joint in a recess formed in the base plate. Moreover, the heat pipe thus formed is provided with a wick all over its inner face.

Moreover, the tube is provided all over its outer circumference with a number of fins arrayed in its axial direction. These fins are fixed on the tube by an adhering or soldering method. It is also preferred that the tube is bulged by means of a mandrel or fluid pressure to hold the fins by its pressure.

In the aforementioned tower type heat pipe type heat sink of the prior art, therefore, the heat of the electronic part jointed to the base plate is transferred from the base plate directly to the working fluid of the heat pipe. As a result, the working fluid evaporates so that its vapor flows to the closed end. As a result, the heat resistance is lowered between the electronic part and the heat pipe. Moreover, the working fluid vapor comes into contact with the inner face of the tube so that it is condensed while transferring its heat to the tube and the fins. In other words, the working fluid transports the heat by its latent heat.

The heat thus transported is dissipated from the fins to the atmosphere so that the electronic part is indirectly cooled with the ambient air. Here, the working fluid condensed refluxes through the wick to the base plate so that it is evaporated again to transport the heat.

In the tower type heat sink of the prior art thus far described, the working fluid encapsulated by the heat pipe makes direct contact with the base plate, on which the electronic part is mounted, to transfer the heat from the base plate. This direct contact can reduce the heat resistance between the electronic part and the heat pipe. However, the portion for transferring the heat of the electronic part to the working fluid is restricted on that portion of the upper face of the base plate which is located on the inner side of the tube. Therefore, the area of the heat transfer to the working fluid is not always so sufficiently wide as to raise a disadvantage to restrict the heat radiation characteristics of the entire heat sink or the cooling characteristics of the electronic part.

Here, the heat sink thus far described is intended to enlarge the area for the working fluid to make contact with the base plate by enlarging the diameter of the opened end of the tube. With this construction, however, the tube has not the simple pipe shape but the so-called "modified shape", which increases or complicates the steps for working the tube. As a result, there arises another disadvantage that the productivity of the heat sink drops.

SUMMARY OF THE INVENTION

The present invention has been conceived noting the technical problems thus far described and has an object to provide a tower type heat sink which is excellent in the heat transfer or radiation characteristics and in the productivity.

In order to achieve the above-specified object, according to the invention, there is provided a tower type heat sink which is characterized in that a base portion is provided with the so-called "hub structure" for holding a heat pipe by fitting it closely. According to the present invention, more specifically, there is provided a tower type finned heat pipe type heat sink comprising: a base portion having one face to be contacted by an exothermic member; a heat pipe erected on the other face of said base portion; and a plurality of fins mounted on the outer face of said heat pipe. Further comprised are an axially short cylindrical member erected on said other face of said base portion; and a heat pipe container having one end portion closed and the other end portion opened and fitted at its opened end closely in said cylindrical member. Said heat pipe is constructed by evacuating the inside of said heat pipe container and then by encapsulating a working fluid in said heat pipe container, so that a heat may be transferred to said heat pipe through said base portion and said cylindrical member.

According to the present invention, therefore, the heat generated by the exothermic member is transferred to the base portion and to the working fluid in the heat pipe. At the same time, the heat is transferred through the cylindrical member integrated with the base portion to the circumference of the end portion of the heat pipe container and further to the working fluid. Thus, the working fluid is heated and evaporated over that wide area, and the vapor flows in the heat pipe to the other end portion so that the heat carried by the vapor is dissipated from the fins to the outputs. Moreover, the working fluid condensed refluxes toward the base portion and performs again the function to transport the heat.

In the present invention, on the other hand, the heat sink further comprises: a wick member mounted on that portion of the other face of said base portion, which is positioned inside of said heat pipe container, for creating a capillary pressure in said working fluid. The wick member can be made of a sintered porous material.

According to the present invention, therefore, the reflux and dispersion of the working fluid to the surface of the base portion are promoted to increase the heat transport by the heat pipe so that the radiation characteristics of the entire heat sink are improved.

According to the present invention, the heat sink further comprises: a nozzle mounted in the closed one end portion of said heat pipe container and protruding from said one end portion; and a protective member filling said one end portion while burying said nozzle therein. The protective member can be made of synthetic rubber.

According to a feature of the invention, the evacuation of the heat pipe container and the encapsulation of the working fluid can be easily executed through the nozzle. Moreover, the nozzle can be prevented from being damaged by an excessive external force.

According to the present invention, said fins are made of sheet-shaped annular members having such elastic fitting portions on their inner circumference edges as are elastically deformed in directions to enlarge the internal diameters, so that said fins are fitted and mounted closely on said heat pipe container by elastic forces created by said elastic fitting portions. Each of said elastic fitting portions can include: an annular flat plate portion; a cylindrical portion bent axially from the inner circumference edge of said flat plate portion; and a curved portion curved to protrude axially thereby to join said curved portion and said flat plate portion.

According to the present invention, therefore, the fins are fitted on the outer circumference of the heat pipe container so that their elastic fitting portions are elastically deformed. By the accompanying elastic forces, the fins are mounted in close contact with the heat pipe container.

According to the present invention, the heat sink further comprises a wick mounted on the inner face of said heat pipe container for creating a capillary pressure in said working fluid.

According to the present invention, therefore, the working fluid can be dispersed widely over the inner face of the heat pipe to promote the heat transfer with the outside and the reflux of the condensed working fluid. This results in an improvement in the thermal characteristics of the heat sink as a whole.

The above and further objects and novel features of the invention will more fully appear from the following detailed description when the same is read with reference to the accompanying drawings. It is to be expressly understood, however, that the drawings are for the purpose of illustration only and are not intended as a definition of the limits to the invention.

DESCRIPTION OF THE PREFERRED EMBODIMENT

Figure 1:
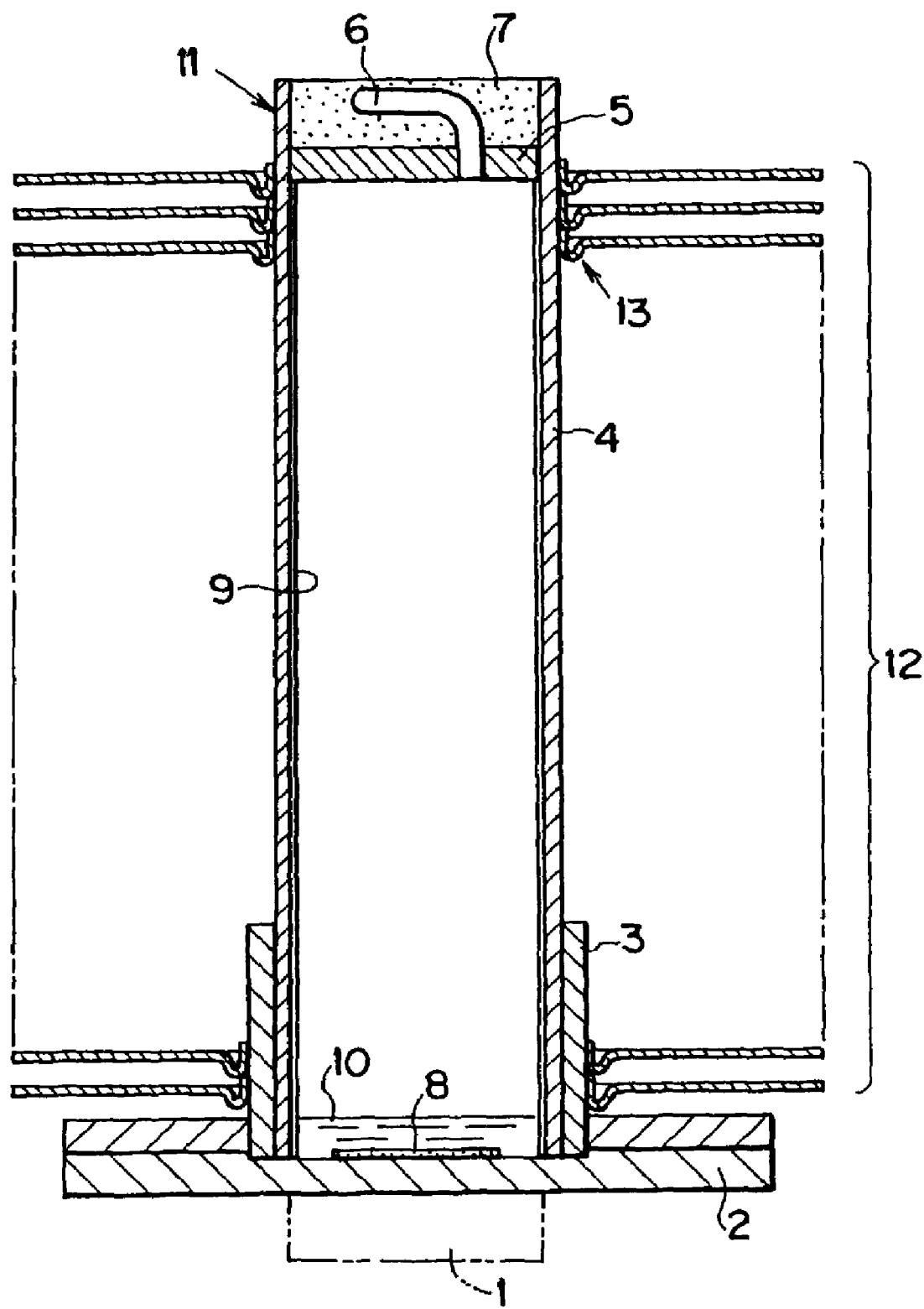
FIG. 1 is a simplified sectional view showing one embodiment of the invention.
Figure 2:
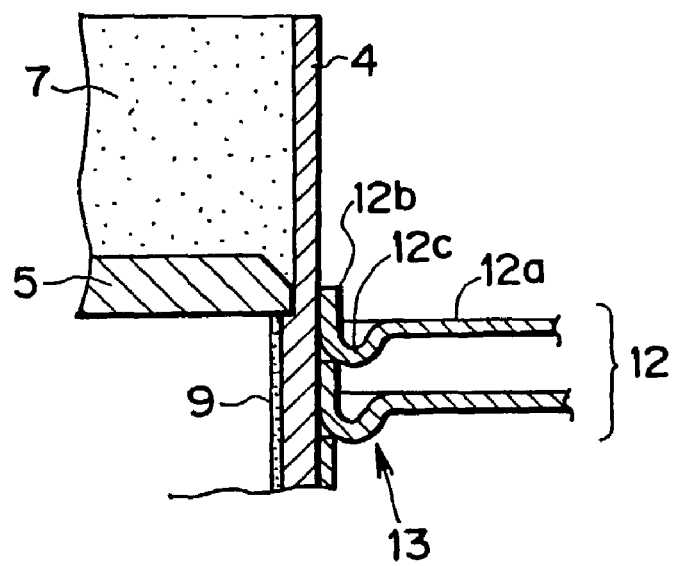
FIG. 2 is a sectional view showing a portion of the embodiment.
Figure 3:
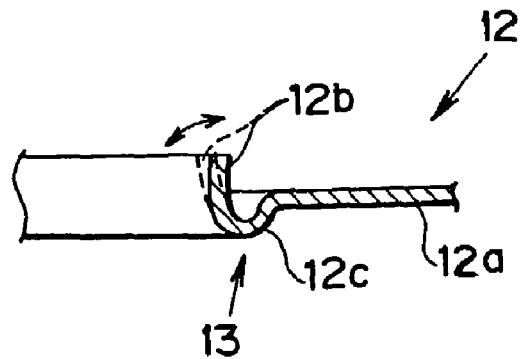
FIG. 3 is a partially sectional view showing one example of an elastic fitting portion of a fin of the embodiment.

The invention will be described in connection with a specific embodiment shown in FIGS. 1 to 3. The embodiment shown in FIGS. 1 to 3 is constructed to cool such an electronic part 1 of the LSI as corresponds to an exothermic member in the invention. This electronic part 1 is so contacted by a base portion 2 as to transfer its heat to the latter. The base portion 2 is formed of a highly conductive metal such as aluminum, copper or its alloy into a flat plate shape.

In the embodiment shown in FIGS. 1 to 3, the base portion 2 is formed to have a lower face for contacting or jointing the electronic part 1. On the upper face of the base portion 2, there is erected a hub 3 which has a short cylindrical shape and acts as a holding member. This hub 3 is made of a metal like that of the base portion 2 and is jointed gastight to the upper face of the base portion 2 by soldering means.

In the hub 3, on the other hand, there is closely fitted a heat pipe container 4 which is formed into a thin pipe shape. This heat pipe container 4 is jointed gastight to the base portion 2 and the hub 3 by soldering means with its leading end portion (as located at the lower end portion of FIGS. 1 to 3) abutting against the upper face of the base portion 2.

In the other end portion (as located at the upper end portion of FIGS. 1 to 3) of the heat pipe container 4, on the other hand, there is gastight fitted an end plate 5, by which the upper end portion of the heat pipe container 4 is sealed up. In this end plate 5, there is mounted therethrough a nozzle 6 which has a thin pipe shape. Moreover, this nozzle 6 is curved in the direction along the outer face (as located at the upper face of FIGS. 1 to 3) of the end plate 5. The nozzle 6 is buried in the curved state in a protective member 7 made of synthetic resin such as silicone rubber, by filling the protective member 7 over the upper face of the end plate 5.

Over the upper face of the base portion 2, there is disposed a wick member 8 for creating a capillary pressure. This wick member 8 is located inside of the heat pipe container 4. The wick member 8 is exemplified by a porous material and is prepared either by flame-spraying a powdery material such as copper powder onto the upper face of the base portion 2 or by sintering the powdery material in a sheet shape or a thin plate sheet and then adhering or sintering the sheet or thin plate to the upper face of the base portion 2.

On the inner circumference of the heat pipe container 4, on the other hand, there is formed a roughed wick member 9. This roughed wick member 9 is prepared either by jointing a sheet-shaped or thinned cylindrical member sintered of a powdery material such as copper powder, to the inner circumference of the heat pipe container 4, or by flame-spraying the powdery material onto the inner circumference of the heat pipe container 4, or by blasting the inner circumference of the heat pipe container 4.

Moreover, the inside of the heat pipe container 4 is evacuated through the nozzle 6 and is filled with a working fluid 10 of a condensable fluid such as water or alcohol, to construct a heat pipe 11.

This heat pipe 11 is provided with a number of heat radiation fins 12 on its outer circumference, i.e., on the outer circumferences of the heat pipe container 4 and the hub 3. These fins 12 are made of annular thin plate members made of a metal such as aluminum or its alloy and are mounted by fitting them on the heat pipe container 4 and the hub 3.

On the inner circumference of each fin 12, more specifically, there is formed an elastic fitting portion 13. This elastic fitting portion 13 is a portion for creating an elastic force to fasten the heat pipe container 4 or the hub 3. As shown in an enlarged scale in FIGS. 2 and 3, a flat plate portion 12a is bent at its inner circumferential portion over a predetermined width in the axial direction, to form a cylindrical portion 12b, so that the portion joining the cylindrical portion 12b and the flat plate portion 12a is curved to protrude backward of the leading end of the cylindrical portion 12b thereby to form a curved portion 12c. Therefore, the curvature of the curved portion 12c is elastically varied to establish an elastic force of the radial direction in the cylindrical portion 12b. Here, the minimum internal diameter of the cylindrical portion 12b in the so-called "free state", in which no load acts on the elastic fitting portion 13, is made smaller than the external diameter of the heat pipe container 4 and the external diameter of the hub 3.

Therefore, each fin 12 can be fitted by moving it in the axial direction relative to the heat pipe container 4 and the hub 3. Then, the elastic fitting portion 13 is elastically deformed to establish an elastic force to fasten the outer circumferences of the heat pipe container 4 and the hub 3 so that the elastic fitting portion 13 is fixed on the heat pipe container 4 and the hub 3 by that elastic force. As shown in FIG. 2, moreover, the individual cylindrical portions 12b are determined in their axial positions and pitches by their abutting engagements.

With these structures, the fins 12 can be easily mounted on the heat pipe container 4 and the hub 3. Moreover, the fins 12 are closely mounted on the heat pipe container 4 and the hub 3 by their elastic forces so that the heat resistances in between are lowered. Here, the fins 12 may also be positively fixed by adhering or welding means.

In the heat sink thus constructed, the electronic part 1 in contact with the lower face of the base portion 2 inevitably generates a heat when it is energized to act. This heat is transferred to the wick member 8 on the upper face of the base portion 2 and further to the working fluid 10 held in the wick member 8, so that the working fluid 10 evaporates. In this case, only the base portion 2 but no member is interposed between the electronic part 1 and the working fluid 10 so that the heat resistance in between is low. As a result, the heat of the electronic part 1 is efficiently transferred to the working fluid 10. In other words, the electronic part 1 can be efficiently cooled.

Moreover, the hub 3 is integrated with the base portion 2 so that the heat of the electronic part 1 is transferred from the base portion 2 through the hub 3 to the heat pipe 11. Specifically, the heat of the working fluid 10 is transferred through that portion of the heat pipe container 4, which is fitted in the hub 3, and through the vicinity. Thus, the portion and its vicinity provide the so-called "evaporation portion". Therefore, the heat transfer to the working fluid 10 occurs at both the upper face of the base portion 2 and the inner circumference of the lower end portion of the heat pipe container 4 thereby to enlarge the heat transfer area for the working fluid 10. In this point, the electronic part 1 can be efficiently cooled.

In the heat sink thus constructed, moreover, the heat pipe container 4 can be sealed up gastight by jointing the hub 3 integrally to the upper face of the base portion 2 and by fitting and jointing the heat pipe container 4 in and to the hub 3. Therefore, the hub 3 and the heat pipe container 4 may be made of simple pipe-shaped members so that they can be easily manufactured.

Here, the invention should not be limited to the specific embodiment thus far described. For example, the invention may be used such that the exothermic member such as the electronic part is placed on the upper side. Moreover, the exothermic member need not be directly contacted by the base portion but may be contacted thereby through some heat transfer member.

On the other hand, the invention need not be purposely provided with the roughed wick on the inner circumference of the heat pipe container. In this modification, the arrangement may be made such that the condensed working fluid is refluxed by the gravity. When the heat pipe container is to be fitted in the cylindrical member, moreover, it may be fitted on either the inner or outer circumferential side, and the invention should not be limited to the structure, as exemplified in the foregoing specific embodiment.

According to the present invention, as has been described hereinbefore, the heat generated by the exothermic member is transferred to the working fluid in the heat pipe through both the base portion and the cylindrical member integrated with the base portion. Thus, the working fluid is heated and evaporated over that wide area, and the vapor flows in the heat pipe to the other end portion so that the heat carried by the vapor is dissipated from the fins to the outputs. Therefore, the number of members interposed between the exothermic member and the working fluid is small so that their heat resistance can be reduced. In addition, the area for the heat transfer to the working fluid can be enlarged to increase the calorie to be received from the exothermic member and dissipated thereby to provide a heat sink having excellent thermal characteristics. On the other hand, the heat pipe container and the cylindrical member for fitting the container may be formed into the simple pipe shape but need not be worked into any special shape. Therefore, the working for the manufacture can be facilitated to improve the productivity and to lower the cost for the heat sink.

According to the present invention, on the other hand, the reflux and dispersion of the working fluid 10 to the surface of the base portion can be promoted to increase the heat transport by the heat pipe so that the radiation characteristics of the entire heat sink can be improved.

According to the present invention, moreover, the evacuation of the heat pipe container and the encapsulation of the working fluid can be easily executed through the nozzle. Moreover, the nozzle can be prevented from being damaged by an excessive external force, by means of protection member According to the present invention, still moreover, the fins are fitted on the outer circumference of the heat pipe container so that their elastic fitting portions are elastically deformed. By the accompanying elastic forces, the fins can be mounted in close contact with the heat pipe container. Therefore, the fin mounting works are facilitated to improve the productivity of the heat sink. Moreover, the fins are fitted closely in the heat pipe container so that the heat resistances of their fitted portions can be reduced to improve the thermal characteristics of the heat sink.

According to the present invention, furthermore, the working fluid can be dispersed widely over the inner face of the heat pipe to promote the heat transfer with the outside and the reflux of the condensed working fluid. Therefore, it is possible to improve the thermal characteristics of the heat sink as a whole.

The invention claimed is:

1. A tower type finned heat pipe type heat sink comprising:
   a base portion having a first face and a second face, the first face configured to contact an exothermic member;
   a cylindrical member disposed on said second face of said base portion;
   a heat pipe disposed on the second face of the base portion and concentric with said cylindrical member, wherein the cylindrical member holds the heat pipe, the heat pipe configured to retain a working fluid to transfer heat from the exothermic member through the base portion; and a plurality of fins mounted on an outer surface of the heat pipe and the cylindrical member.

2. The tower type finned heat pipe type heat sink according to claim 1, further comprising:
   a wick member mounted on the second face of said base portion within an interior of the heat pipe, the wick member configured to create a capillary pressure in said working fluid.

3. The tower type finned heat pipe type heat sink according to claim 2, further comprising:
   a nozzle mounted in a closed end portion of said heat pipe and protruding from said closed end portion; and
   a protective member covering a portion of said nozzle.

4. A tower type finned heat pipe type heat sink comprising:
   a base portion having a first face and a second face, the first face configured to contact an exothermic member;
   a cylindrical member disposed on said second face of said base portion;
   a heat pipe disposed on the second face of the base portion, the heat pipe configured to retain a working fluid to transfer heat from the exothermic member through the base portion;
   a plurality of fins mounted on an outer surface of the heat pipe, wherein a portion of the outer surface of said heat pipe contacts a portion of the cylindrical member;
   a wick member mounted on the second face of said base portion within an interior of the heat pipe, the wick member configured to create a capillary pressure in said working fluid;
   a nozzle mounted in a closed end portion of said heat pipe and protruding from said closed end portion; and
   a protective member covering a portion of said nozzle, wherein said protective member comprises synthetic rubber.

5. The tower type finned heat pipe type heat sink according to claim 2, wherein at least one of said plurality of fins comprises a sheet-shaped annular member having an elastic fitting portion on an inner circumference edge, the elastic fitting portion configured to be elastically deformed to enlarge an internal diameter of the elastic fitting portion.

6. The tower type finned heat pipe type heat sink according to claim 5, wherein said elastic fitting portion comprises a cylindrical portion extending along an axis of the heat pipe and configured to be elastically deformed, and a curved portion joining said cylindrical portion and a flat plate portion of said at least one of said plurality of fins.

7. The tower type finned heat pipe type heat sink according to claim 2, wherein said wick member comprises a sintered porous material.

8. The tower type finned heat pipe type heat sink according to claim 7, further comprising:
   a nozzle mounted in a closed end portion of said heat pipe and protruding from said closed end portion; and
   a protective member covering a portion of said nozzle.

9. The tower type finned heat pipe type heat sink according to claim 4, wherein said wick member comprises a sintered porous material.

10. The tower type finned heat pipe type heat sink according to claim 7, wherein at least one of said plurality of fins comprises a sheet-shaped annular member having an elastic fitting portion on an inner circumference edge, the elastic fitting portion configured to be elastically deformed to enlarge an internal diameter of the elastic fitting portion.

11. The tower type finned heat pipe type heat sink according to claim 10, wherein said elastic fitting portion comprises a cylindrical portion extending along an axis of the heat pipe and configured to be elastically deformed, and a curved portion joining said cylindrical portion and a flat plate portion of said at least one of said plurality of fins.

12. The tower type finned heat pipe type heat sink according to claim 1, further comprising:
   a nozzle mounted in a closed end portion of said heat pipe and protruding from said closed end portion; and
   a protective member covering a portion of said nozzle.

13. A tower type finned heat pipe type heat sink comprising:
   a base portion having a first face and a second face, the first face configured to contact an exothermic member;
   a cylindrical member disposed on said second face of said base portion;
   a heat pipe disposed on the second face of the base portion, the heat pipe configured to retain a working fluid to transfer heat from the exothermic member through the base portion;
   a plurality of fins mounted on an outer surface of the heat pipe, wherein a portion of the outer surface of said heat pipe contacts a portion of the cylindrical member;
   a nozzle mounted in a closed end portion of said heat pipe and protruding from said closed end portion; and
   a protective member covering a portion of said nozzle, wherein said protective member comprises synthetic rubber.

14. The tower type finned heat pipe type heat sink according to claim 1, wherein at least one of said plurality of fins comprises a sheet-shaped annular member having an elastic fitting portion on an inner circumference edge, the elastic fitting portion configured to be elastically deformed to enlarge an internal diameter of the elastic fitting portion.

15. The tower type finned heat pipe type heat sink according to claim 14, wherein said elastic fitting portion comprises a cylindrical portion extending along an axis of the heat pipe and configured to be elastically deformed, and a curved portion joining said cylindrical portion and a flat plate portion of said at least one of said plurality of fins.

16. The tower type finned heat pipe type heat sink according to claim 1, further comprising:
   a wick mounted on an inner face of said heat pipe, the wick configured to create a capillary pressure in said working fluid.

17. The tower type finned heat pipe type heat sink according to claim 1, wherein the cylindrical member a constant diameter.

18. The tower type finned heat pipe type heat sink according to claim 13, further comprising a wick mounted on the second face of said base portion within the interior of said heat pipe, the wick configured to create a capillary pressure in said working fluid.

* * * * *